(12) United States Patent
Kim et al.

(10) Patent No.: US 8,885,421 B2
(45) Date of Patent: Nov. 11, 2014

(54) SEMICONDUCTOR MEMORY DEVICE

(71) Applicant: SK Hynix Inc., Gyeonggi-do (KR)

(72) Inventors: Min-Su Kim, Gyeonggi-do (KR);
Jin-Su Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 13/660,786

(22) Filed: Oct. 25, 2012

(65) Prior Publication Data
US 2013/0107636 A1 May 2, 2013

(30) Foreign Application Priority Data
Oct. 27, 2011 (KR) .................. 10-2011-0110493

(51) Int. Cl.
*G11C 7/10* (2006.01)
*G11C 16/04* (2006.01)
*G11C 16/10* (2006.01)
*G11C 16/08* (2006.01)

(52) U.S. Cl.
CPC .......... *G11C 16/0408* (2013.01); *G11C 7/1078* (2013.01); *G11C 16/10* (2013.01); *G11C 16/08* (2013.01)
USPC ............. 365/189.02; 365/230.02; 365/189.05

(58) Field of Classification Search
CPC .... G11C 7/1006; G11C 7/1078; G11C 16/10; G11C 16/1006; G11C 16/1048
USPC ............. 365/189.02, 189.12, 230.02, 230.03, 365/230.08, 189.05
See application file for complete search history.

(56) References Cited

U.S. PATENT DOCUMENTS

| 7,616,630 | B2 * | 11/2009 | Ha et al. | 370/386 |
| 7,817,470 | B2 * | 10/2010 | Kim | 365/185.11 |
| 2005/0276146 | A1 * | 12/2005 | Ha et al. | 365/230.03 |
| 2008/0123423 | A1 * | 5/2008 | Kim | 365/185.11 |

* cited by examiner

*Primary Examiner* — Gene Auduong
(74) *Attorney, Agent, or Firm* — IP & T Group LLP

(57) ABSTRACT

A semiconductor memory device includes a memory bank configured to store data, a buffering unit including a plurality of buffers, which are disposed to extend to a X-axis of the memory bank to store data transferred from the memory bank, a plurality of data transmission lines configured to transfer the data stored in the plurality of buffers, and a path multiplexing unit configured to select one of a plurality of data transmission paths in response to addresses and transfer the data through the selected data transmission path.

14 Claims, 5 Drawing Sheets

SEMICONDUCTOR MEMORY DEVICE

CROSS-REFERENCE TO RELATED APPLICATIONS

The present application claims priority of Korean Patent Application No. 10-2011-0110493, filed on Oct. 27, 2011, which is incorporated herein by reference in its entirety.

BACKGROUND

1. Field

Exemplary embodiments of the present invention relate to a semiconductor design technology, and more particularly, to a semiconductor memory device provided with data transmission lines.

2. Description of the Related Art

In general, a semiconductor memory device is classified into a volatile memory device or a nonvolatile memory device. Dynamic Random Access Memory (DRAM) and Static Random Access Memory (SRAM) are representative volatile memory devices. Programmable Read Only Memory (PROM), Erasable PROM (EPROM), Electrically EPROM (EEPROM), and flash memory device are nonvolatile memory devices. The most important characteristic for distinguishing the volatile memory device from the nonvolatile memory device is whether data stored in a memory cell is retained in a non-powered condition.

In other words, in the volatile memory device, the data stored in the memory cell is not retained in a non-powered condition, while in the nonvolatile memory device, the data stored in the memory cell is retained in a non-powered condition. Especially, in the case of DRAM, a refresh operation is necessary in order to retain data, and such a refresh operation is not necessary in the non-volatile memory device. Since such a characteristic of the non-volatile memory device is suitable for low power and high integration, the non-volatile memory device has been extensively used as a storage medium of a portable apparatus in recent years.

FIG. 1 is a diagram for explaining an internal configuration of a conventional semiconductor memory device. For the convenience of description, a configuration corresponding to one memory bank 110 will be described as an example.

Referring to FIG. 1, the semiconductor memory device includes the memory bank 110, a plurality of buffers PB[0:7] arranged in a buffer area 120, and a plurality of column selection units CS[0:4K−1].

The memory bank 110 is configured to store desired data, and be accessed in response to an address (not illustrated) that includes predetermined number of bits. Each of the buffers PB[0:7] stores data, which are stored in a plurality of memory cells in a read operation, and transfers the stored data to bit lines BL[0:7] and bit bar lines /BL[0:7] in response to activated one of a plurality of selection signals S[0:4K−1]. The plurality of column selection units CS[0:4K−1] decode input addresses and activate a corresponding selection signal based on the decoded input addresses.

Hereinafter, a read operation of the semiconductor memory device will be described.

First, in the read operation, the data stored in the memory bank 110 are loaded to the plurality of buffers PB[0:7]. The plurality of column selection units CS[0:4K−1] activate one of the plurality of selection signals S[0:4K−1] in response to the input addresses, and corresponding buffers are activated in response to the activated selection signal. Then, data stored in the activated buffers are transferred to the bit lines BL[0:7] and the bit bar lines /BL[0:7]. The transferred data is amplified and output by a sense amplifier (not illustrated).

FIG. 2 is a circuit diagram for explaining a detailed structure of the plurality of buffers PB[0:7] of FIG. 1.

For reference, a group of the buffers PB[0], which is coupled to a $0^{th}$ bit line BL[0] and a $0^{th}$ bit bar line /BL[0], is referred to as a $0^{th}$ buffering unit 200.

Referring to FIG. 2, a buffer PB[0] of the $0^{th}$ buffering unit 200, which is activated in response to a $0^{th}$ selection signal S[0], includes a latching section 210 for storing data in response to a control signal (not illustrated) and a transfer section 220 for transferring the data stored in the latching section 210 to the $0^{th}$ bit line BL[0] and the $0^{th}$ bit bar line /BL[0] in response to the $0^{th}$ selection signal S[0]. The activation of the buffer PB[0] in response to the $0^{th}$ selection signal S[0] represents that an NMOS transistor of the transfer section 220 is turned on in response to the $0^{th}$ selection signal S[0], and the data stored in the latching section 210 is transferred to the $0^{th}$ bit line BL[0] and the $0^{th}$ bit bar line /BL[0].

Meanwhile, in a conventional structure, the $0^{th}$ bit line BL[0] and the $0^{th}$ bit bar line /BL[0] are connected to the plurality of buffers PB[0] of the $0^{th}$ buffering unit 200. That is, junction capacitance of all transistors connected to a corresponding bit line is reflected in the $0^{th}$ bit line BL[0] and the $0^{th}$ bit bar line /BL[0]. In other words, capacitance of the $0^{th}$ bit line BL[0] and the $0^{th}$ bit bar line /BL[0] are obtained by adding junction capacitance of 8K transistors to self-capacitance of the $0^{th}$ bit line BL[0] and the $0^{th}$ bit bar line /BL[0], which correspond to a length LOB of the $0^{th}$ buffering unit 200, where two transistors are connected to each other per one buffer. The length LOB of the $0^{th}$ buffering unit 200 represents a length corresponding to the buffer area 120 (referring to FIG. 1). In other words, the length LOB of the $0^{th}$ buffering unit represents a length corresponding to the number of the buffers PB[0] provided in the $0^{th}$ buffering unit 200. In FIG. 2, since the number of the buffers PB[0] provided the $0^{th}$ buffering unit 200 is 4K, the $0^{th}$ bit line BL[0] and the $0^{th}$ bit bar line /BL[0] have lengths corresponding to 4K buffers.

The aforementioned capacitance of the $0^{th}$ bit line BL[0] and the $0^{th}$ bit bar line /BL[0] are reflected in other bit lines and bit bar lines in the same manner, other than the $0^{th}$ bit line BL[0] and the $0^{th}$ bit bar line /BL[0]. Here, an increase in the capacitance reflected in the bit line and the bit bar line represents an increase in a time for precharging the bit line and the bit bar line, and thus, represents an increase in a time for sensing data transferred through the bit line and the bit bar line. Therefore, the increase in the time for sensing the data may reduce a data processing speed of the semiconductor memory device.

SUMMARY

Exemplary embodiments of the present invention are directed to a semiconductor memory device with data transmission lines that are shorter than a length of buffers.

In accordance with an embodiment of the present invention, a semiconductor memory device includes a memory bank configured to store data, a buffering unit including a plurality of buffers which are disposed to extend to an X-axis of the memory bank to store data transferred from the memory bank, a plurality of data transmission lines configured to transfer the data stored in the plurality of buffers, and a path multiplexing unit configured to select one of a plurality of data transmission paths in response to addresses and transfer the data through the selected data transmission path.

In accordance with another embodiment of the present invention, a semiconductor memory device includes a plurality of sub-buffering units configured to correspond to one memory bank and to be obtained by grouping a plurality of buffers based on a predetermined number, a plurality of data transmission lines, each configured to receive respective data stored in the buffers provided in the sub-buffering units, and have a length corresponding to a length of each of the buffering units, and a path multiplexing unit configured to select one of data transmission paths in response to addresses, and output one of the data transferred through the plurality of data transmission lines.

In accordance with another embodiment of the present invention, a semiconductor memory device includes a first buffering unit configured to comprise a plurality of buffers corresponding to a first bit line, a second buffering units configured to comprise a plurality of buffers corresponding to a second bit line, and a first path multiplexing unit configured to be arranged between the first buffering unit and the second buffering unit, and to select one of data transmission paths between the buffers provided in the first buffering unit and the first bit line.

In the semiconductor memory device in accordance with the embodiment of the present invention, data transmission lines having lengths shorter than a length of buffers are arranged, so that it may be possible to reduce capacitance affecting the data transmission lines.

The lengths of the data transmission lines arranged in the semiconductor memory device are made to be shorter than the length of the buffers, so that the capacitance affecting the data transmission lines may be reduced, thereby improving a data processing speed of the semiconductor memory device.

Furthermore, it is possible to perform a precharging operation only for transmission lines for which a data transmission operation is performed. This may also result in the reduction of a precharging time.

DETAILED DESCRIPTION

Figure 1:
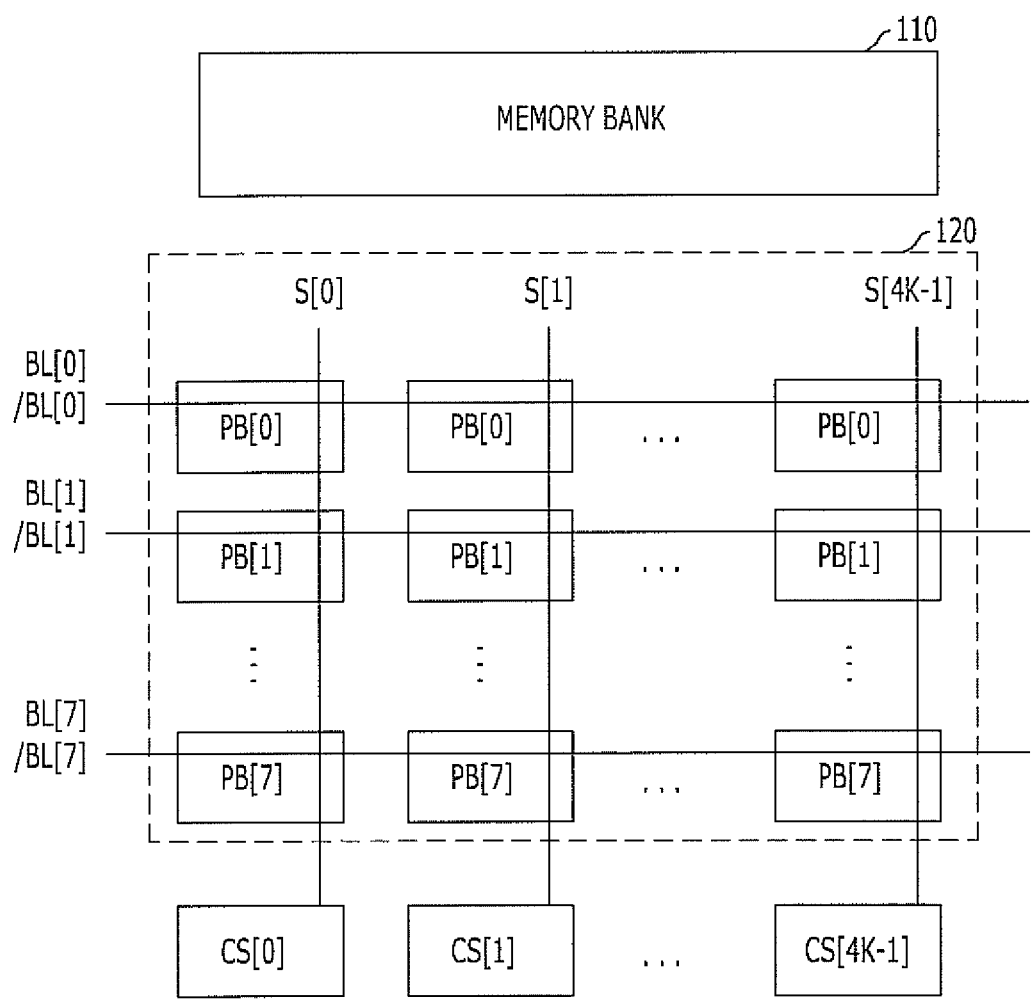
FIG. 1 is a diagram for explaining an internal configuration of a conventional semiconductor memory device.
Figure 2:
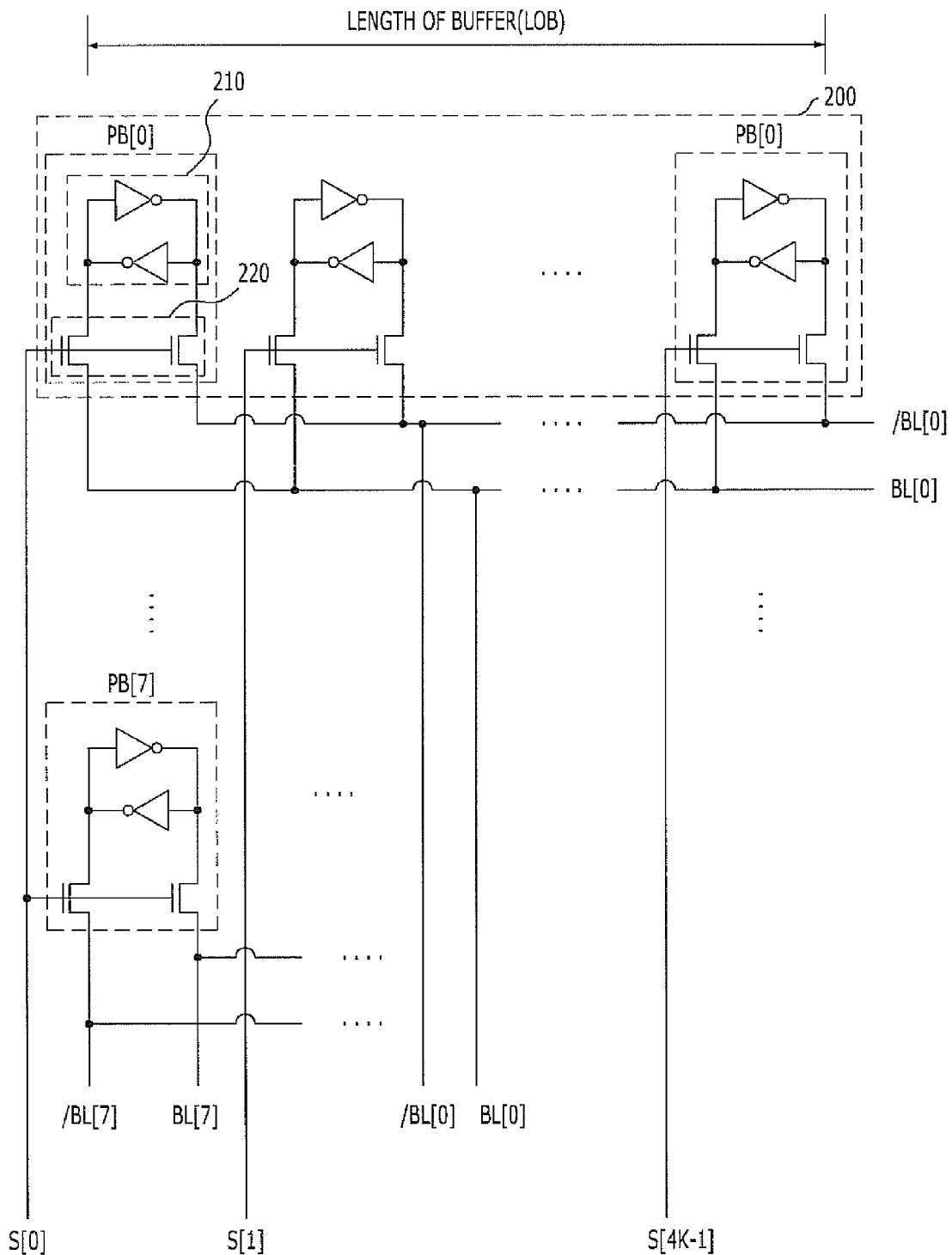
FIG. 2 is a circuit diagram for explaining a detailed structure of a plurality of buffers of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
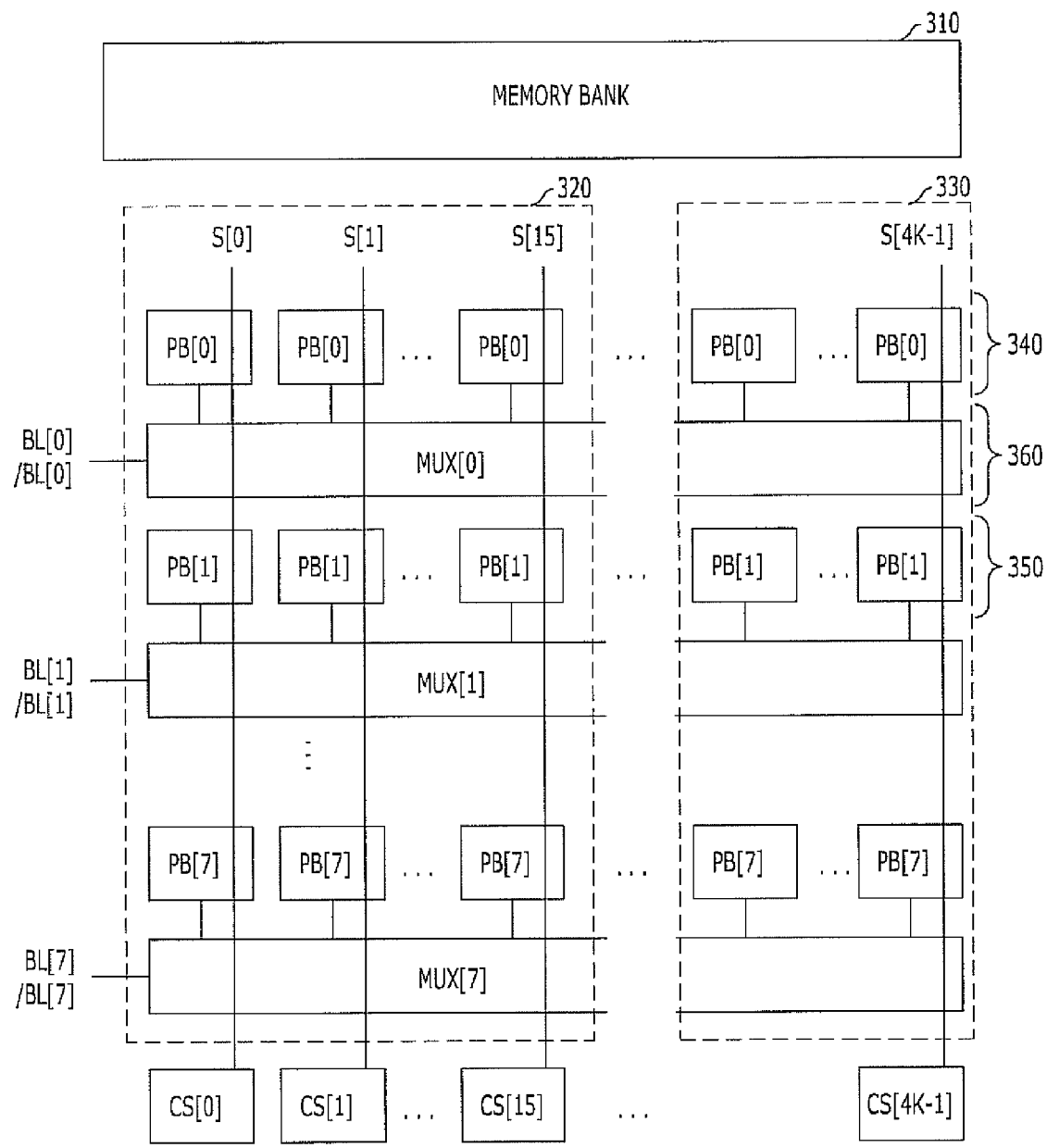
FIG. 3 is a diagram for explaining an internal configuration of a semiconductor memory device in accordance with an embodiment of the present invention.

FIG. 3 is a diagram for explaining an internal configuration of a semiconductor memory device in accordance with an embodiment of the present invention. A configuration corresponding to one memory bank 310 will be described as an example.

Referring to FIG. 3, the semiconductor memory device includes the memory bank 310, a plurality of buffers PB[0:7], and a plurality of column selection units CS[0:4K−1].

The memory bank 310 is configured to store desired data and be accessed in response to an address (not illustrated) that includes predetermined number of bits. Each of the buffers PB[0:7] is configured to store data, which are stored in a plurality of memory cells in a read operation, and transfer the stored data to a plurality of path multiplexing units MUX[0:7] in response to an activated selection signal of a plurality of selection signals S[0:4K−1]. Here, the buffers PB[0] are disposed to extend to an X-axis of the memory bank 310, and the other buffers PB[1], PB[2], . . . PB[7] are also disposed to extend to the X-axis of the memory bank 310. The plurality of path multiplexing units MUX[0:7] is configured to select ones of data transmission paths between the plurality of buffers PB[0:7] and bit lines BL[0:7] or bit bar lines /BL[0:7]. The plurality of column selection units CS[0:4K−1] are configured to decode input addresses and activate one of the plurality of selection signals S[0:4K−1] that corresponds to input addresses in response to the decoded input addresses.

In the semiconductor memory device in accordance with the embodiment of the present invention, first to $256^{th}$ buffer areas 320, . . . , 330 corresponds to one memory bank 310, and each buffer area includes the plurality of buffers PB[0:7]. Here, a group of the buffers PB[0], which is coupled to a $0^{th}$ bit line BL[0] and a $0^{th}$ bit bar line /BL[0], is referred to as a $0^{th}$ buffering unit 340, and a group of the buffers PB[1], which is coupled to a first bit line BL[1] and a first bit bar line /BL[1], is referred to as a first buffering unit 350. The $0^{th}$ path multiplexing unit MUX[0] is arranged between the $0^{th}$ buffering unit 340 and the first buffering unit 350. Furthermore, the $0^{th}$ buffering unit 340 and the $0^{th}$ path multiplexing unit MUX[0] corresponding to the $0^{th}$ buffering unit 340 are arranged adjacent to each other while being included in the buffer area, and the other path multiplexing units MUX[1:7] in addition to the $0^{th}$ path multiplexing unit MUX[0] are also included in the buffer area.

Hereinafter, a read operation of the semiconductor memory device will be described.

First, the data stored in the memory bank 310 is loaded to the plurality of the buffers PB[0:7]. The plurality of column selection units CS[0:4K−1] activate one of the plurality of selection signals S[0:4K−1] in response to the input addresses. Some of the plurality of buffers PB[0:7] are activated in response to the activated selection signal of the plurality of selection signals S[0:4K−1]. At this time, each of the path multiplexing units MUX[0:7] selects one of a plurality of data transmission paths between the activated buffers PB[0:7] and bit lines BL[0:7] or bit bar lines /BL[0:7] to ensure that transmission paths correspond to the input addresses, and data stored in the activated buffers is transferred to the bit lines BL[0:7] and the bit bar lines /BL[0:7] through the transmission paths.

Figure 4:
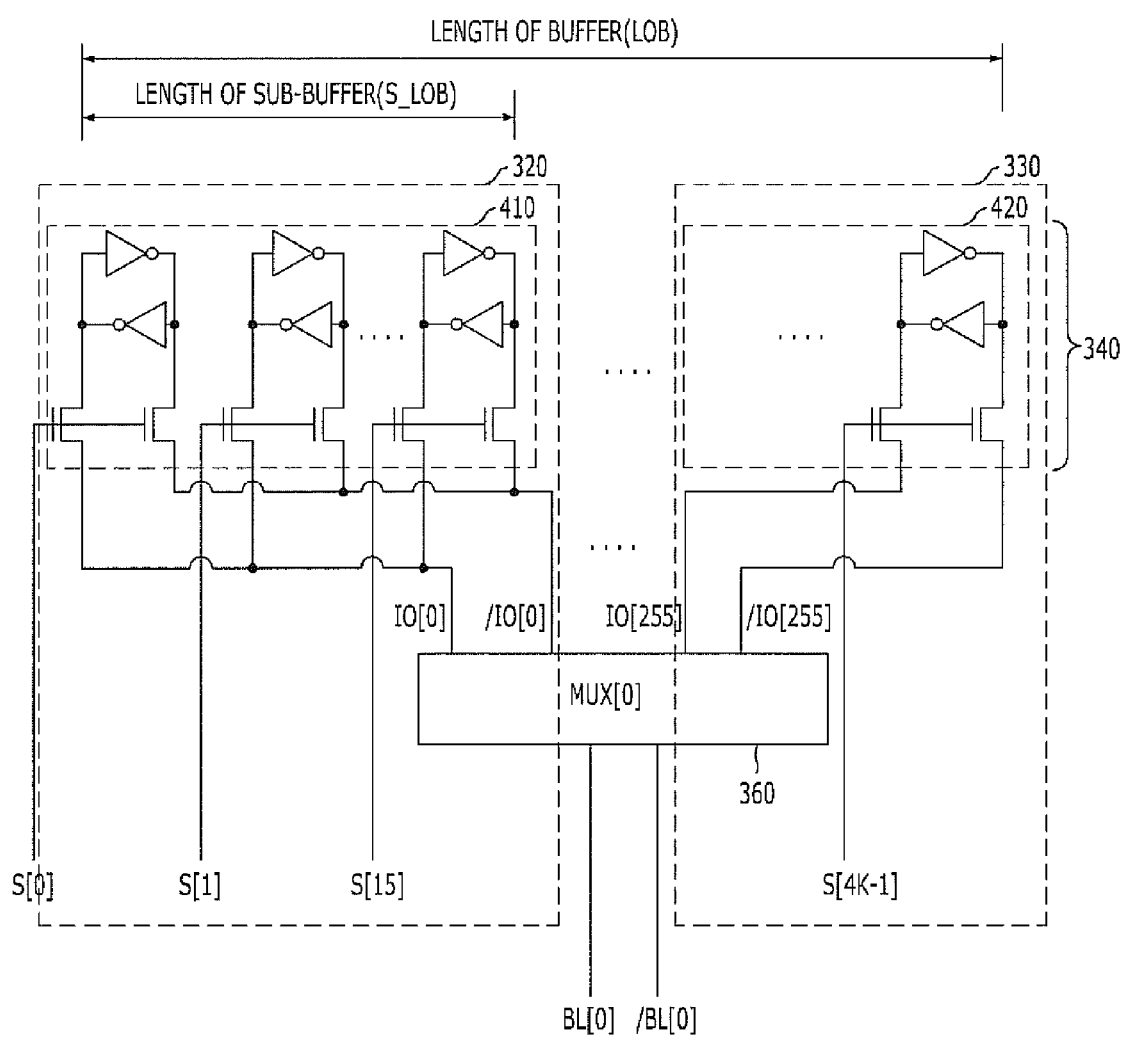
FIG. 4 is a diagram for explaining in more detail each element of FIG. 3.

FIG. 4 is a diagram for explaining in more detail each element of FIG. 3, and the same reference numerals are used to designate the same elements as those of FIG. 3.

The $0^{th}$ buffering unit 340 and the $0^{th}$ path multiplexing unit 360 (MUX[0]) of FIG. 3 are representatively illustrated. A structure including a sub-buffering unit for grouping 16 buffers in one buffer area will be described as an example.

As shown in FIG. 4, in the semiconductor memory device in accordance with the embodiment of the present invention, a first sub-buffering unit 410, which is arranged in the first buffer area 320, is connected to a $0^{th}$ data transmission line IO[0] and a $0^{th}$ data transmission bar line /IO[0], and a $256^{th}$ sub-buffering unit 420, which is arranged in the $256^{th}$ buffer area 330, is connected to a 256$^{th}$ data transmission line IO[255] and a 256$^{th}$ data transmission bar line /IO[255]. The 0$^{th}$ path multiplexing unit 360 (MUX[0]) transfers data, which is transferred through the data transmission lines IO[0:255] and the data transmission bar lines /IO[0:255] of the first to 256$^{th}$ buffer areas 320, . . . , 330 to the 0$^{th}$ bit line BL[0] and the 0$^{th}$ bit bar line /BL[0].

That is, the semiconductor memory device in accordance with the embodiment of the present invention includes the first to 256$^{th}$ sub-buffering units 410, . . . , 420, which are obtained by grouping a plurality of buffers based on a predetermined number in correspondence with one memory bank, where the first to 256$^{th}$ sub-buffering units 410, . . . , 420 are connected to the 0$^{th}$ to 255$^{th}$ data transmission lines IO[0:255] and the 0$^{th}$ to 255$^{th}$ data transmission bar lines /IO[0:255], respectively. The 0$^{th}$ to 255$^{th}$ data transmission lines IO[0:255] and the 0$^{th}$ to 255$^{th}$ data transmission bar lines /IO[0:255] have lengths corresponding to the first to 256$^{th}$ sub-buffering units 410, . . . , 420. For example, the 0$^{th}$ data transmission line IO[0] and the 0$^{th}$ data transmission bar line /IO[0] have lengths corresponding to a total length of the buffers provided in the first sub-buffering unit 410 arranged in the first buffer area 320. In the present specification, this length will be referred to as a "length of sub-buffering unit S_LOB" and the length of sub-buffering unit S_LOB is shorter than a length LOB of the 0$^{th}$ buffering unit 340.

Figure 5:
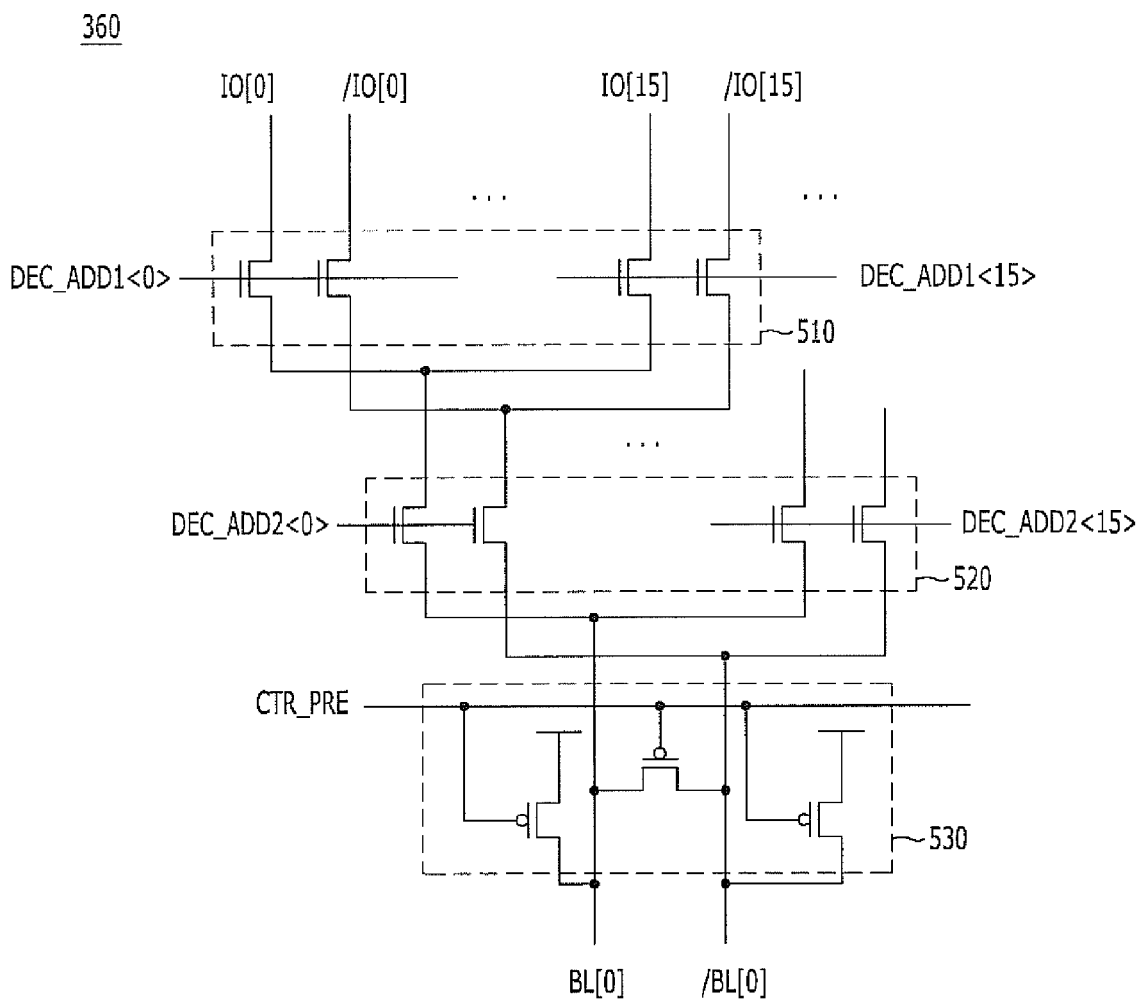
FIG. 5 is a diagram for explaining a $0^{th}$ path multiplexing unit of FIG. 3 and FIG. 4.

FIG. 5 is a diagram for illustrating the 0$^{th}$ path multiplexing unit 360 (MUX[0]) of FIG. 3 and FIG. 4.

Referring to FIG. 5, the 0$^{th}$ path multiplexing unit 360 (MUX[0]) includes a first path selection section 510, a second path selection section 520, and a bit line precharging section 530. The first path selection section 510 is configured to select one of transmission paths between 0$^{th}$ to 15$^{th}$ data transmission lines IO[0:15] or 0$^{th}$ to 15$^{th}$ data transmission bar lines /IO[0:15] and the second path selection section 520 in response to first decoded signals DEC_ADD1<0:15> obtained by decoding a part of input addresses. The second path selection section 520 is configured to select one of transmission paths between the first path selection section 510 and the 0$^{th}$ bit line BL[0] and the 0$^{th}$ bit bar line /BL[0] in response to second decoded signals DEC_ADD2<0:15> obtained by decoding a remaining part of the input addresses. The bit line precharging section 530 is configured to precharge the 0$^{th}$ bit line BL[0] and the 0$^{th}$ bit bar line /BL[0] in response to a precharging control signal CTR_PRE.

The 0$^{th}$ path multiplexing unit 360 in accordance with the embodiment of the present invention selects a part of the transmission paths in response to the first decoded signals DEC_ADD1<0:15> and selects a remaining part of the transmission paths in response to the second decoded signals DEC_ADD2<0:15>. In the exemplary embodiment of the present invention, the 0$^{th}$ path multiplexing unit 360 has a two stage configuration. However, it is possible to change the number of stages according to different design considerations. As a result, in the 0$^{th}$ path multiplexing unit 360, the first and second path selection sections 510 and 520 select the transmission paths in response to addresses, and one of data, which is transferred through the 0$^{th}$ to 255$^{th}$ data transmission lines IO[0:255] and the 0$^{th}$ to 255$^{th}$ data transmission bar lines /IO[0:255], is transferred to the 0$^{th}$ bit line BL[0] and the 0$^{th}$ bit bar line /BL[0] through the transmission paths selected by the first and second path selection sections 510 and 520.

Meanwhile, as illustrated in FIG. 4, the 0$^{th}$ to 255$^{th}$ data transmission lines IO[0:255] and the 0$^{th}$ to 255$^{th}$ data transmission bar lines /IO[0:255] are connected to the 16 buffers provided in one sub-buffering unit, respectively. As illustrated in FIG. 5, the 0$^{th}$ to 255$^{th}$ data transmission lines IO[0:255] and the 0$^{th}$ to 255$^{th}$ data transmission bar lines /IO[0:255] are grouped into 16 data transmission lines and are connected to the first path selection section 510. 16 output signals of the first path selection section 510 are connected to the second path selection section 520, and the second path selection section 520 is connected to the 0$^{th}$ bit line BL[0] and the 0$^{th}$ bit bar line /BL[0].

Thus, in the read operation, the capacitance of a transmission line, through which data is transferred, corresponds to the length of sub-buffering unit S_LOB illustrated in FIG. 4. In more detail, in addition to the capacitance corresponding to the length S_LOB of the sub-buffering unit, the junction capacitance of 30 transistors of the 0$^{th}$ path multiplexing unit 360 are reflected. However, the capacitance of the embodiment of present invention may be much smaller compared to capacitance of a conventional structure.

Table 1 below illustrates comparison of operation speeds of the conventional structure and the structure in accordance with the embodiment of the present invention.

TABLE 1

|  | Conventional | present invention |
| --- | --- | --- |
| precharging time | 5.2 ns | 2.5 ns |
| data sensing time | 11 ns | 3.1 ns |
| data holding time | 2.5 ns | 2 ns |
| Sum | 18.7 ns | 7.6 ns |

In Table 1 above, the data precharging time denotes a time required for precharging the bit lines and the bit bar lines. The data sensing time denotes a time required for sensing data transferred through the bit lines and the bit bar lines, and the data holding time denotes a time required when a sense amplifier transfers data. As a consequence, it is possible to reduce a time, which is required when data stored in the buffers is transferred to the sense amplifier through the data transmission lines or the data transmission bar lines and the bit lines or the bit bar lines, and is output from the sense amplifier, to 7.6 ns.

As described above, the semiconductor memory device in accordance with the embodiment of the present invention reduces capacitance to be reflected in the bit lines and the bit bar lines, thereby obtaining an effect of improving the data processing speed of the semiconductor memory device. Furthermore, as apparent from Table 1 above, it is possible to perform the precharging operation only for transmission lines for which the data transmission operation is performed, which results in the reduction of the precharging time.

While the present invention has been described with respect to the specific embodiments, it will be apparent to those skilled in the art that various changes and modifications may be made without departing from the spirit and scope of the invention as defined in the following claims.

Moreover, the positions and types of the logic gates and transistors in the aforementioned embodiment may be changed according to the polarity of an input signal.

What is claimed is:
1. A semiconductor memory device comprising:
a memory bank configured to store data;
a buffering unit including a plurality of buffers, which are disposed to extend to an X-axis of the memory bank and coupled to a bit line of the memory bank to store data transferred from the memory bank;
a plurality of data transmission lines configured to transfer the data stored in the plurality of buffers; and
a path multiplexing unit configured to select one of a plurality of data transmission paths in response to addresses and transfer the data, which is stored in the plurality of buffers, to the bit line through the selected data transmission path.

2. The semiconductor memory device of claim 1, wherein each of the data transmission lines has a length shorter than a total length of the buffers provided in the buffering unit.

3. The semiconductor memory device of claim 1, further comprising:
   a column selection unit configured to generate a selection signal for activating the buffers in response to the addresses.

4. The semiconductor memory device of claim 1, wherein the path multiplexing unit is configured to select a part of the data transmission paths in response to a part of the addresses, and select a remaining part of the data transmission paths in response to a remaining part of the addresses.

5. A semiconductor memory device comprising:
   a plurality of sub-buffering units configured to correspond to one memory bank and to be obtained by grouping a plurality of buffers, which are coupled to a bit line of the memory bank, based on a predetermined number;
   a plurality of data transmission lines, each configured to receive respective data stored in buffers provided in one of the sub-buffering units, and have a length corresponding to a length of the one of the sub-buffering units; and
   a path multiplexing unit configured to select one of data transmission paths in response to addresses, and output data stored in the plurality of buffers to the bit line through the selected data transmission lines.

6. The semiconductor memory device of claim 5, wherein the length of each of the data transmission lines corresponds to a total length of the buffers provided in each of the sub-buffering units.

7. The semiconductor memory device of claim 5, wherein the length of each of the data transmission lines corresponds to the number of the buffers included in each of the sub-buffering units.

8. The semiconductor memory device of claim 5, further comprising:
   a column selection unit configured to generate a selection signal for activating the buffers in response to the addresses.

9. The semiconductor memory device of claim 5, wherein the path multiplexing unit is configured to select a part of the data transmission paths in response to a part of the addresses, and select a remaining part of the data transmission paths in response to a remaining part of the addresses.

10. A semiconductor memory device comprising:
    a first buffering unit configured to comprise a plurality of buffers corresponding to a first bit line;
    a second buffering unit configured to comprise a plurality of buffers corresponding to a second bit line; and
    a first path multiplexing unit configured to be arranged between the first buffering unit and the second buffering unit, and to select one of first data transmission lines between the buffers provided in the first buffering unit and the first bit line.

11. The semiconductor memory device of claim 10, wherein the first buffering unit, the second buffering unit, and the first path multiplexing unit are arranged in a buffer area.

12. The semiconductor memory device of claim 10, further comprising:
    a second path multiplexing unit configured to select one of second data transmission lines between the buffers provided in the second buffering unit and the second bit line.

13. The semiconductor memory device of claim 12, wherein the first data transmission lines have a length corresponding to the number of the buffers provided in the first buffering unit, and the second data transmission lines have a length corresponding to the number of the buffers provided in the second buffering unit.

14. The semiconductor memory device of claim 10, wherein the first path multiplexing unit is configured to select a part of the first data transmission lines in response to a part of the addresses, and select a remaining part of the first data transmission lines in response to a remaining part of the addresses.

* * * * *